(12) United States Patent
Lee et al.

(10) Patent No.: US 6,406,945 B1
(45) Date of Patent: Jun. 18, 2002

(54) METHOD FOR FORMING A TRANSISTOR GATE DIELECTRIC WITH HIGH-K AND LOW-K REGIONS

(75) Inventors: James Yong Meng Lee, Singapore (SG); Ying Keung Leung, Hong Kong (HK); Yelehanka Ramachandramurthy Pradeep; Jia Zhen Zheng, both of Singapore (SG); Lap Chan, San Francisco, CA (US); Elgin Quek, Singapore (SG); Ravi Sundaresan, San Jose, CA (US); Yang Pan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/769,810

(22) Filed: Jan. 26, 2001

(51) Int. Cl.⁷ .............................................. H01L 21/335
(52) U.S. Cl. ...................... 438/142; 438/151; 438/159; 438/163; 438/247; 438/299; 438/301; 438/303; 438/197; 257/368; 257/388; 257/392; 257/408; 257/410; 257/411; 257/900
(58) Field of Search ................... 438/397, 142, 438/151, 159, 163, 247, 299, 301, 303; 257/368, 388, 392, 408, 410, 411

(56) References Cited

U.S. PATENT DOCUMENTS

| | | | |
|---|---|---|---|
| 5,736,435 A | 4/1998 | Venkatesan et al. | 438/151 |
| 5,882,971 A | 3/1999 | Wen | 438/276 |
| 5,952,700 A | 9/1999 | Yoon | 257/405 |
| 6,163,060 A * | 12/2000 | Gardner et al. | 438/410 |
| 6,242,776 B1 * | 6/2001 | Hause et al. | 257/344 |
| 6,255,703 B1 * | 7/2001 | Hause et al. | 257/384 |
| 6,271,132 B1 * | 8/2001 | Xiang et al. | 438/682 |
| 6,284,580 B1 * | 9/2001 | Takehiro | 438/197 |
| 6,351,013 B1 * | 2/2002 | Luning et al. | 257/368 |

\* cited by examiner

Primary Examiner—Matthew Smith
Assistant Examiner—Belur Keshavan
(74) Attorney, Agent, or Firm—George O. Saile; Rosemary L. S. Pike; William J. Stoffel

(57) ABSTRACT

A method for forming a gate dielectric having regions with different dielectric constants. A dummy dielectric layer is formed over a semiconductor structure. The dummy dielectric layer is patterned to form a gate opening. A high-K dielectric layer is formed over the dummy dielectric and in the gate opening. A low-K dielectric layer is formed on the high-K dielectric layer. Spacers are formed on the low-K dielectric layer at the edges of the gate opening. The low-K dielectric layer is removed from the bottom of the gate opening between the spacers. The spacers are removed to form a stepped gate opening. The stepped gate opening has both a high-K dielectric layer and a low-K dielectric layer on the sidewalls and at the edges of the bottom of the gate opening and only a high-k dielectric layer in the center of the bottom of the stepped gate opening. A gate electrode is formed in the stepped gate opening.

17 Claims, 3 Drawing Sheets

METHOD FOR FORMING A TRANSISTOR GATE DIELECTRIC WITH HIGH-K AND LOW-K REGIONS

BACKGROUND OF INVENTION

1.) Field of the Invention

This invention relates generally to fabrication of a semiconductor device and more particularly to a method for forming a transistor gate dielectric with a combination of high dielectric constant and low dielectric constant regions.

2.) Description of the Prior Art

In MOS (metal on silicon) transistor technology, a gate dielectric is formed on a silicon substrate, and a gate electrode is formed over the gate dielectric. Source and drain regions are formed adjacent the gate electrode and the gate dielectric. When a voltage is applied to the gate electrode, electrons (NMOS) or holes (PMOS) flow across the region of the silicon substrate under the gate dielectric, known as the channel. As the channel length decreases, the electrons in an NMOS transistor gain sufficient energy from the electric field to enter the gate dielectric layer where they become trapped, changing the gate threshold voltage (e.g. hot carrier effect).

To reduce the hot carrier effect, a lightly doped drain region LDD is formed between the channel and the source/drain, lowering the electric field. However, the reduced impurity concentration in the LDD causes parasitic resistance, reducing drive current and slowing down the transistor.

Another problem with LDD structured MOS transistors is that the overlap of the gate electrode over the LDD regions with a thin gate dielectric between them causes capacitance, called overlap capacitance, which further slows the transistor. The higher the dielectric constant, the greater the overlap capacitance.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,952,700 (Yoon) shows a process for forming a two-layer gate dielectric on one side of the gate.

U.S. Pat. No. 5,882,971 (Wen) shows a method for forming a read-only memory (ROM) using spacers (43) on the sidewall of s gate trench.

U.S. Pat. No. 5,736,435 (Venkatesan et al.) shows a gate in a trench with spacers on the trench.

SUMMARY OF THE INVENTION

It is an object of the present invention to provide a method for forming a gate dielectric having regions of varying dielectric constant.

It is another object of the present invention to provide a method for increasing drive current in a gate channel while reducing hot carrier effects and overlap capacitance.

It is yet another object of the present invention to provide a method for reducing channel length without causing detrimental short channel effects and overlap capacitance.

To accomplish the above objectives, the present invention provides a method for forming a gate dielectric having regions with different dielectric constants. A dummy dielectric layer is formed over a semiconductor structure. The dummy dielectric layer is patterned to form a gate opening. A high-K dielectric layer is formed over the dummy dielectric and in the gate opening. A low-K dielectric layer is formed on the high-K dielectric layer. Sidewall spacers are formed on the low-K dielectric layer at the edges of the gate opening. The low-K dielectric layer is removed from the bottom of the gate opening between the sidewall spacers. The sidewall spacers are removed to form a stepped gate opening. The stepped gate opening has both a high-K dielectric layer and a low-K dielectric layer on the sidewalls and at the edges of the bottom of the gate opening and only a high-k dielectric layer in the center of the bottom of the stepped gate opening. A gate electrode is formed in the stepped gate opening.

The present invention provides considerable improvement over the prior art. A gate dielectric can be formed having regions with different dielectric constants. The high-K dielectric region allows the drive current ($Id_{sat}$) in a gate channel to be increased. The low-K dielectric regions at the edges of the gate electrode reduce hot carrier effects and overlap capacitance. The gate dielectric of the present invention provides a method for reducing channel length without causing detrimental short channel effects and overlap capacitance.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a gate dielectric having regions with different dielectric constants. At the edges of the channel, where hot carrier effects are most likely to occur, the gate dielectric comprises both a high-K and a low-K dielectric region. In the middle of the channel, the gate dielectric comprises only a high-K dielectric region allowing drive current with reduced overlap capacitance.

Figure 1:
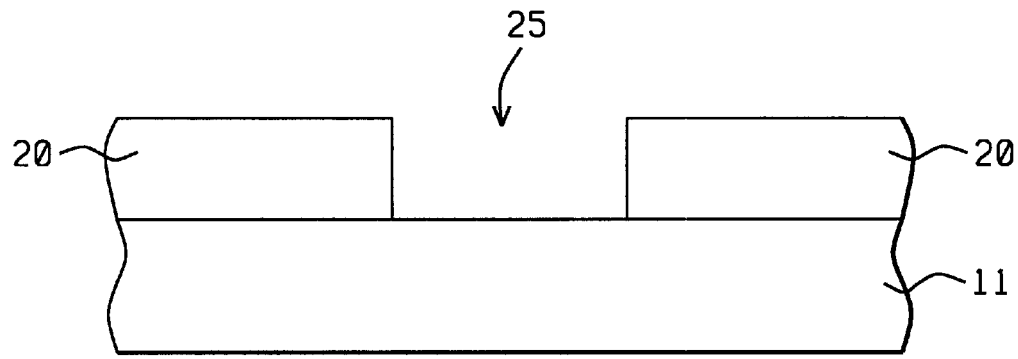
FIGS. 1 through 7 illustrate sequential sectional views of a process for forming a gate dielectric having regions with different dielectric constants according to the present invention.

Referring to FIG. 1, the present invention begins by providing a semiconductor structure (11). Semiconductor structure (11) should be understood to possibly include a wafer or substrate of semiconducting material, such as monocrystalline silicon, or a similar structure now known or later developed, such as a silicon-on-insulator (SOI) structure. Semiconductor structure (11) should be further understood to possibly include one or more conductive and or insulating layers formed over the substrate or like structure, and one or more active and/or passive devices formed on or over the substrate or like structure.

Still referring to FIG. 1, a dummy layer (20) is formed over the semiconductor structure (11) and patterned to form a gate opening (25). The dummy layer (20) has a thickness of at least the desired thickness of a gate electrode. The dummy layer (20) can comprise any of a variety of materials which can be conformally deposited, most preferably silicon nitride.

As shown in FIG. 1, the dummy layer (20) is patterned to form a gate opening (25). The semiconductor structure (11) is exposed in the bottom of the gate opening (25). The width of the gate opening (25) is sufficient to encompass a gate electrode with a high-K dielectric layer and a low-K dielectric layer, which will described below, on each side of the gate electrode.

Figure 2:
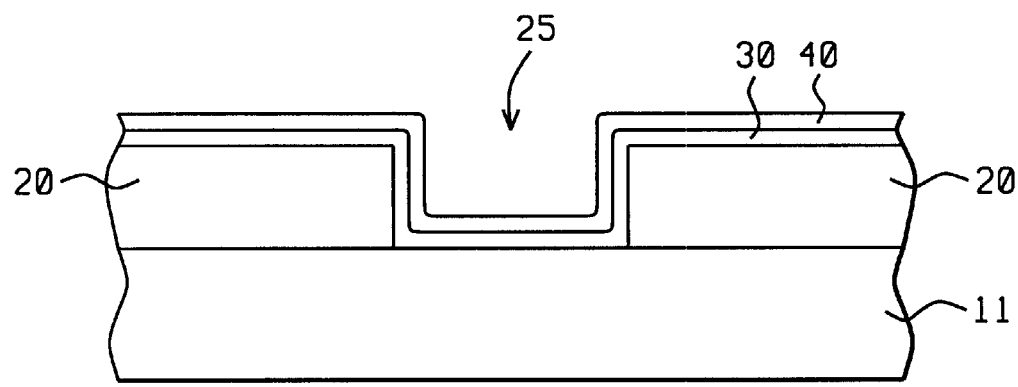

Referring now to FIG. 2, a high-K dielectric layer (30) is formed in the gate opening (25). The high-K dielectric layer (30) can comprise any of the presently-known or later-developed high-K materials, including but not limited to: $ZrO_2$, $Ta_2O_5$, $TiO_2$, and $Si_3N_4$. The high-K dielectric layer (40) is preferably formed to a thickness of between about 10 angstroms and 100 angstroms by sputtering. A high-K dielectric material shall be understood to be a material with a dielectric constant greater than 3.9 and preferably greater than 8.0.

Still referring to FIG. 2, a low-K dielectric layer (40) is formed on the high-K dielectric layer (30). The low-K dielectric layer (40) will be used to form low-K regions at the edges of a gate dielectric. The low-K dielectric layer (40) preferably has a thickness of between about 30 angstroms and 100 angstroms and can comprise any low-K material that can be etched selectively to the high-K dielectric layer (30), most preferably fluorinated silicon dioxide. A low-K dielectric material should be understood to be a material having a dielectric constant less than 3.9.

Figure 3:
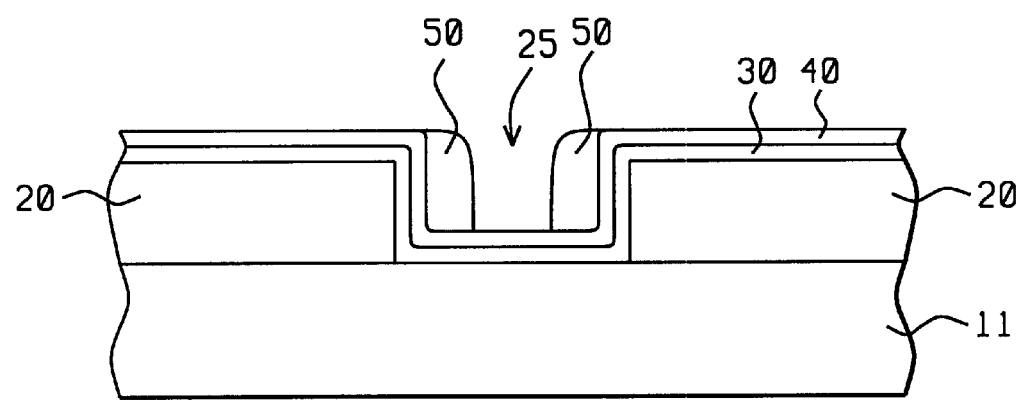

Referring now to FIG. 3, spacers (50) are formed on the sidewalls of the gate opening (25). The spacers (50) can, for example, be formed by depositing a conformal spacer layer and anisotropically etching back the spacer layer. The spacers (50) preferably comprise a material which can be etched selectively to the low-K dielectric layer (40). For example, when the low-K dielectric layer comprises fluorinated silicon dioxide, the spacer layer can comprise silicon nitride or polysilicon.

Figure 4:
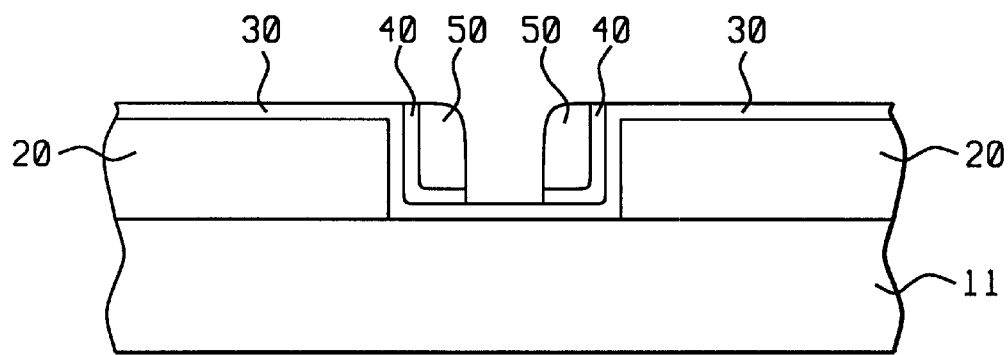

Referring now to FIG. 4, the low-K dielectric layer (40) is etched back at the bottom of the gate opening (25). The low-K dielectric layer (40) at the edges of the gate opening (25) are protected from the etch by the spacers (50). The high-K dielectric (30) preferably acts as an etch stop for the low-K dielectric (40) etch-back. For example, for the high-K dielectric layer may comprise $TaO_6$, $ZrO_2$, $TiO_2$, $ZrSiO_4$, or $Al_2O_3$. The low-K dielectric layer may comprising fluorinated silicon dioxide, carbon doped silicon dioxide, or a low-K organic polymer. The low-K dielectric layer can be etched selectively to the high-K dielectric layer using processes known in the art for the materials used.

Figure 5:
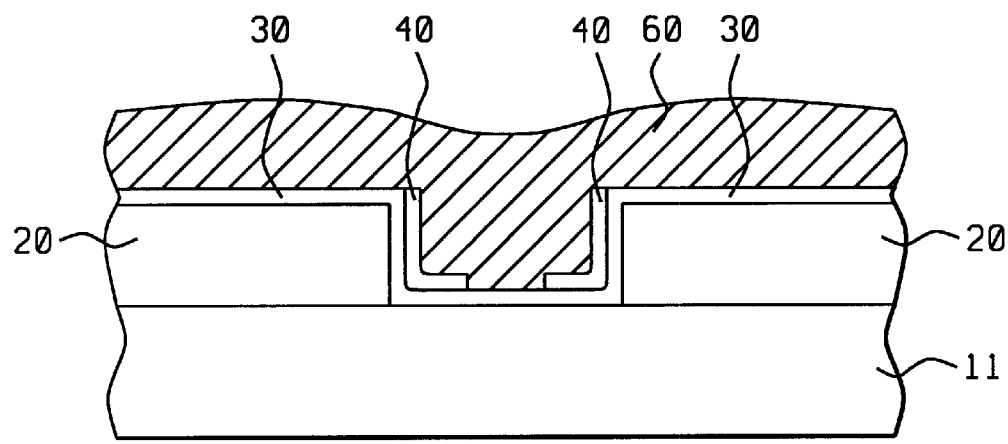

Referring now to FIG. 5, the spacers are removed using an etch selective to the low-K dielectric layer (40) and the high-K dielectric layer (30). After spacers (50) are removed, the gate opening (25) is stepped with only the high-K dielectric layer at the bottom of the gate opening in its center and with the low-K dielectric layer over the high-K dielectric layer on the bottom of the gate opening at its edges and on the sidewalls of the gate opening.

Still referring to FIG. 5, a gate electrode layer (60) is formed over the high-K dielectric layer (30) and the low-K dielectric layer (40) in the gate opening (25). The gate electrode layer (60) can comprise a metal, polysilicon, or a stack of metal and/or polysilicon films, as is known in the art. The gate electrode layer (60) has a sufficient thickness to overfill the gate opening (25). The low-K dielectric layer (40) extends under the gate electrode (60A) a distance of between about 50 angstroms and 200 angstroms at each edge of the gate electrode. This is about the same distance that the lightly doped drain (LDD) extends under the gate.

Figure 6:
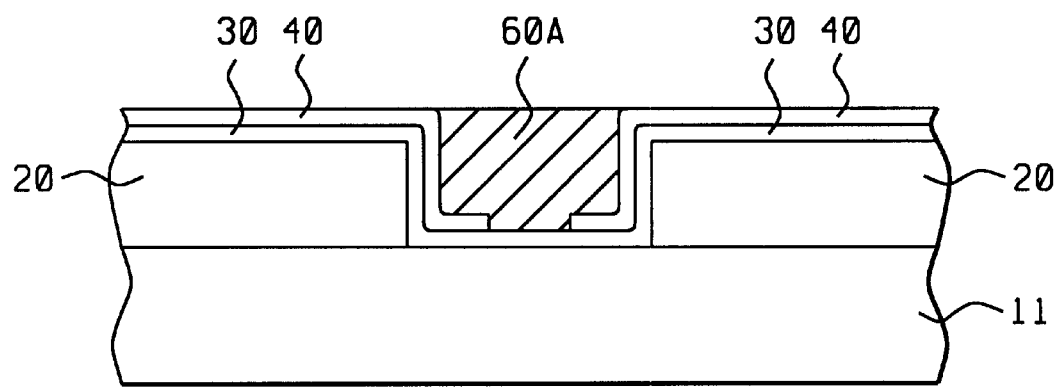

As shown in FIG. 6, the gate electrode layer (60), the low-K dielectric layer (40), and the high-K dielectric layer (30) are planarized stopping on the dummy dielectric layer (40) to form a gate electrode (60A). The planarization is most preferably performed using a chemical-mechanical polishing (CMP) process as is known in the art. The dummy dielectric layer (40) preferably acts as a CMP stop.

Figure 7:
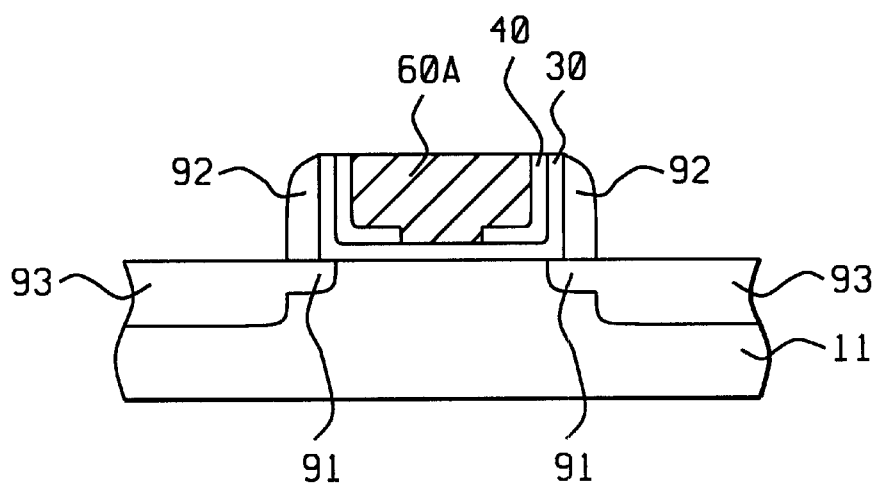

Referring now to FIG. 7, the dummy dielectric layer (not shown) is removed, preferably using an etch which etches the dummy dielectric selectively to the high-K dielectric layer (30), the low-K dielectric layer (40) and the gate electrode (60A). A dummy dielectric layer comprising silicon nitride can be etched selectively to a high-K dielectric layer comprising $ZrO_2$ (zirconium dioxide), a low-K dielectric layer comprising fluorinated silicon dioxide, and a gate electrode comprising polysilicon.

Lightly doped source and drain regions (LDDs) (91) can be formed in the semiconductor structure (11) adjacent the gate electrode (60A) by an impurity ion implant and diffusion anneal as is known in the art. Spacers (92) can be formed adjacent the gate electrode (60A) as is known in the art. Source and drain regions can then be formed in the semiconductor structure (11) adjacent the spacers (92).

The key advantages of the present invention are that a gate dielectric is formed having regions with different dielectric constants. The gate dielectric of the present invention provides a method for increasing drive current in a gate channel while reducing hot carrier effects and overlap capacitance.

While the invention has been particularly shown and described with reference to the preferred embodiments thereof, it will be understood by those skilled in the art that various changes in form and details may be made without departing from the spirit and scope of the invention.

What is claimed is:

1. A method for forming a transistor gate dielectric, comprising the steps of:
   a. forming a dummy layer over a semiconductor structure, and patterning said dummy layer to form a gate opening; wherein the bottom of said gate opening is the top surface of said semiconductor structure;
   b. forming a high-K dielectric layer on the bottom and sidewalls of said dummy dielectric layer, and forming a low-K dielectric layer on said high-K dielectric layer;
   c. forming spacers on the sidewalls of said gate opening;
   d. etching said low-K dielectric layer where it is not covered by said spacers;
   e. removing said spacers; and
   f. forming a gate electrode on and/or over said high-K dielectric layer and said low-K dielectric layer in said gate opening.

2. The method of claim 1 wherein said low-K dielectric layer comprises fluorinated silicon dioxide.

3. The method of claim 1 wherein said high-K dielectric comprises $ZrO_2$.

4. The method of claim 1 wherein said high-K dielectric comprises $Ta_2O_5$.

5. The method of claim 1 wherein said high-K dielectric comprises $TiO_2$.

6. The method of claim 1 wherein said high-K dielectric comprises $Si_3N_4$.

7. The method of claim 1 wherein said low-K dielectric layer has a thickness of between about 30 angstroms and 100 angstroms and said high-K dielectric has a thickness of between about 10 angstroms and 100 angstroms.

8. The method of claim 1 wherein said low-K dielectric layer extends under the gate electrode a distance of between about 50 angstroms and 200 angstroms at each edge of the gate electrode.

9. The method of claim 1 which further comprise the steps of:
   (g) planarizing said gate-electrode, said low-K dielectric layer; and said high-K dielectric layer stopping on said dummy layer;
   (h) removing said dummy layer;
   (i) forming lightly doped source and drain regions in said semiconductor structure adjacent said gate electrode;
   (j) forming spacers adjacent said gate electrode; and
   (k) forming source and drain regions in said semiconductor structure adjacent said spacers.

10. The method of claim 9 wherein said low-K dielectric extends over at least a portion of said lightly doped source/drain regions.

11. A method for forming a transistor gate dielectric, comprising the steps of:
   a. forming a dummy layer over a semiconductor structure, and patterning said dummy layer to form a gate opening; wherein the bottom of said gate opening is the top surface of said semiconductor structure;
   b. forming a high-K dielectric layer on the bottom and sidewalls of said dummy layer, and forming a low-K dielectric layer on said high-K dielectric layer;
   c. forming spacers on the sidewalls of said gate opening;
   d. etching said low-K dielectric layer where it is not covered by said spacers;
   e. removing said spacers;
   f. forming a gate electrode on and/or over said high-K dielectric layer and said low-K dielectric layer in said gate opening; wherein said low-K dielectric layer extends under the gate electrode a distance of between about 50 angstroms and 200 angstroms at each edge of the gate electrode;
   (g) planarizing said gate electrode, said low-K dielectric layer, and said high-K dielectric layer stopping on said dummy layer;
   (h) removing said dummy layer;
   (i) forming lightly doped source and drain regions in said semiconductor structure adjacent said gate electrode;
   (l) forming spacers adjacent said gate electrode; and
   (k) forming source and drain regions in said semiconductor structure adjacent said spacers.

12. The method of claim 11 wherein said low-K dielectric layer comprises fluorinated silicon dioxide.

13. The method of claim 11 wherein said high-K dielectric comprises $ZrO_2$.

14. The method of claim 11 wherein said high-K dielectric comprises $Ta_2O_5$.

15. The method of claim 11 wherein said high-K dielectric comprises $TiO_2$.

16. The method of claim 11 wherein said high-K dielectric comprises $Si_3N_4$.

17. The method of claim 11 wherein said low-K dielectric layer has a thickness of between about 30 angstroms and 100 angstroms and said high-K dielectric has a thickness of between about 10 angstroms and 100 angstroms.

* * * * *